(12) United States Patent
Lee

(10) Patent No.: US 11,011,502 B2
(45) Date of Patent: May 18, 2021

(54) SEMICONDUCTOR PACKAGE

(71) Applicant: NEPES CO., LTD., Chungcheongbuk-do (KR)

(72) Inventor: Jun Kyu Lee, Chungcheongbuk-do (KR)

(73) Assignee: Nepes Co., Ltd., Samseong-myeon (KR)

(*) Notice: Subject to any disclaimer, the term of this patent is extended or adjusted under 35 U.S.C. 154(b) by 0 days.

(21) Appl. No.: 16/242,572

(22) Filed: Jan. 8, 2019

(65) Prior Publication Data
US 2019/0229101 A1  Jul. 25, 2019

(30) Foreign Application Priority Data

Jan. 19, 2018 (KR) .................. 10-2018-0007166
Nov. 5, 2018 (KR) .................. 10-2018-0134443

(51) Int. Cl.
*H01L 25/10* (2006.01)
*H01L 23/552* (2006.01)
(Continued)

(52) U.S. Cl.
CPC ............ *H01L 25/105* (2013.01); *H01L 21/56* (2013.01); *H01L 21/568* (2013.01); *H01L 21/6835* (2013.01); *H01L 23/3128* (2013.01); *H01L 23/3135* (2013.01); *H01L 23/5386* (2013.01); *H01L 23/552* (2013.01); *H01L 24/09* (2013.01); *H01L 24/17* (2013.01); *H01L 24/19* (2013.01); *H01L 24/24* (2013.01); *H01L 24/33* (2013.01); *H01L 24/73* (2013.01); *H01L 2221/68345* (2013.01); *H01L 2221/68359* (2013.01);
(Continued)

(58) Field of Classification Search
None
See application file for complete search history.

(56) References Cited

U.S. PATENT DOCUMENTS 6,928,719 B2 * 8/2005 Kim .................. H03H 9/02913
174/391
7,884,465 B2   2/2011 Yang
(Continued)

FOREIGN PATENT DOCUMENTS

KR         10-0818116 B1     3/2008
KR    10-2011-0105161 A      9/2011
(Continued)

OTHER PUBLICATIONS

Korean language Office Action for corresponding Korean Application No. 10-2018-0134443, dated Jan. 13, 2020, 7p.

*Primary Examiner* — Moazzam Hossain
(74) *Attorney, Agent, or Firm* — Brinks Gilson & Lione

(57) ABSTRACT

A semiconductor package includes a first package including a first semiconductor chip, a first encapsulation layer that covers the first semiconductor chip, and a first redistribution pattern connected to pads of the first semiconductor chip and a second package on the first package, the second package including a second semiconductor chip, a second encapsulation layer that covers the second semiconductor chip, and a second redistribution pattern connected to pads of the second semiconductor chip. The first redistribution pattern is connected to the second redistribution pattern through the first encapsulation layer.

14 Claims, 12 Drawing Sheets

(51) Int. Cl.
*H01L 23/31* (2006.01)
*H01L 23/538* (2006.01)
*H01L 23/00* (2006.01)
*H01L 21/56* (2006.01)
*H01L 21/683* (2006.01)

(52) U.S. Cl.
CPC ............ *H01L 2224/0231* (2013.01); *H01L 2224/02373* (2013.01); *H01L 2224/02379* (2013.01); *H01L 2224/18* (2013.01); *H01L 2224/73253* (2013.01); *H01L 2225/1041* (2013.01); *H01L 2924/18162* (2013.01); *H01L 2924/19105* (2013.01)

(56) References Cited

U.S. PATENT DOCUMENTS

| | | |
|---|---|---|
| 9,978,661 B2 | 5/2018 | Im et al. |
| 10,050,019 B2 | 8/2018 | Kim et al. |
| 2007/0290322 A1* | 12/2007 | Zhao ............... H01L 23/367 257/690 |
| 2010/0140779 A1* | 6/2010 | Lin ............... H01L 23/49816 257/690 |
| 2011/0175221 A1* | 7/2011 | Ni ............... B81B 7/0051 257/737 |
| 2016/0242313 A1* | 8/2016 | Singh ............... H05K 1/184 |
| 2017/0040266 A1* | 2/2017 | Lin ............... H01L 23/5383 |
| 2017/0213793 A1* | 7/2017 | Hurwitz ............... H01L 23/36 |
| 2019/0027469 A1* | 1/2019 | Jeng ............... H01L 23/3128 |

FOREIGN PATENT DOCUMENTS

| | | |
|---|---|---|
| KR | 10-2014-0081548 A | 7/2014 |
| KR | 10-2014-0115593 A | 10/2014 |
| KR | 10-2017-0020663 A | 2/2017 |
| KR | 10-2018-0001699 A | 1/2018 |

* cited by examiner

SEMICONDUCTOR PACKAGE

CROSS-REFERENCE TO RELATED APPLICATIONS

This application claims priority to Korean Patent Application Nos. 10-2018-0007166 and 10-2018-0134443, respectively filed on Jan. 19, 2018 and Nov. 5, 2018, in the Korean Intellectual Property Office, the entirety of all of which are incorporated by reference herein.

BACKGROUND

1. Field

One or more embodiments relate to a semiconductor package.

2. Description of the Related Art

With the remarkable development of the electronics industry and increase in demands of users, electronic devices are miniaturized and lightened. Therefore, semiconductor devices that are core parts of electronic devices need to be highly integrated. In addition, with the development of mobile products, semiconductor devices need to be miniaturized and be multi-functional.

Therefore, in order to provide multifunctional semiconductor packages, research into package on package type semiconductor packages in which a semiconductor package having another function is stacked on one semiconductor package is being performed. When an upper package is larger than a lower package, it is suggested to form the lower package by a fan out wafer level package (FOWLP) type semiconductor package.

SUMMARY

One or more embodiments include a semiconductor package having improved reliability and a method of manufacturing the same.

Additional aspects will be set forth in part in the description which follows and, in part, will be apparent from the description, or may be learned by practice of the presented embodiments.

According to one or more embodiments, there is provided a semiconductor package including a first package including a first semiconductor chip, a first encapsulation layer that covers the first semiconductor chip, and a first redistribution pattern connected to pads of the first semiconductor chip and a second package provided on the first package and including a second semiconductor chip, a second encapsulation layer that covers the second semiconductor chip, and a second redistribution pattern connected to pads of the second semiconductor chip. The first redistribution pattern is connected to the second redistribution pattern through the first encapsulation layer.

In exemplary embodiments, the first encapsulation layer covers at least a part of a surface of the first semiconductor chip in which pads of the first semiconductor chip are provided.

In exemplary embodiments, the first encapsulation layer includes a photosensitive insulating material.

In exemplary embodiments, the semiconductor package further includes a first insulating pattern that covers at least a part of a surface of the first semiconductor chip in which pads of the first semiconductor chip are provided. The first encapsulation layer covers a side surface of the first semiconductor chip.

In exemplary embodiments, the second package further includes passive devices electrically connected to the second redistribution pattern.

In exemplary embodiments, the second encapsulation layer covers at least a part of a surface of the second semiconductor chip in which pads of the second semiconductor chip are provided.

In exemplary embodiments, the second encapsulation layer includes a photosensitive insulating material.

The semiconductor package further includes a second insulating pattern that covers at least a part of a surface of the second semiconductor chip in which pads of the second semiconductor chip are provided. The second encapsulation layer covers a side surface of the second semiconductor chip.

In exemplary embodiments, the semiconductor package further includes an electromagnetic shielding layer that covers at least a part of the first package and at least a part of the second package.

In exemplary embodiments, the semiconductor package further includes an external encapsulation layer that covers the first package, the second package, and the electromagnetic shielding layer.

In exemplary embodiments, the semiconductor package further includes a lower conductive layer that extends on the first package and the external encapsulation layer. The lower conductive layer is connected to the first redistribution pattern of the first package and the electromagnetic shielding layer.

In exemplary embodiments, the semiconductor package further includes a thermal conductive film provided on the first package and the external encapsulation layer and covering at least a part of the lower conductive layer.

In exemplary embodiments, the semiconductor package further includes a third package provided under the first package. The third package includes a third semiconductor chip, an integrated passive device (IPD), a third encapsulation layer that covers the third semiconductor chip and the IPD, and third redistribution pattern connected to the first redistribution pattern through the third encapsulation layer.

In exemplary embodiments, the third semiconductor chip is an artificial intelligence (AI) processor.

In exemplary embodiments, the IPD is ring-shaped to surround the third semiconductor chip.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
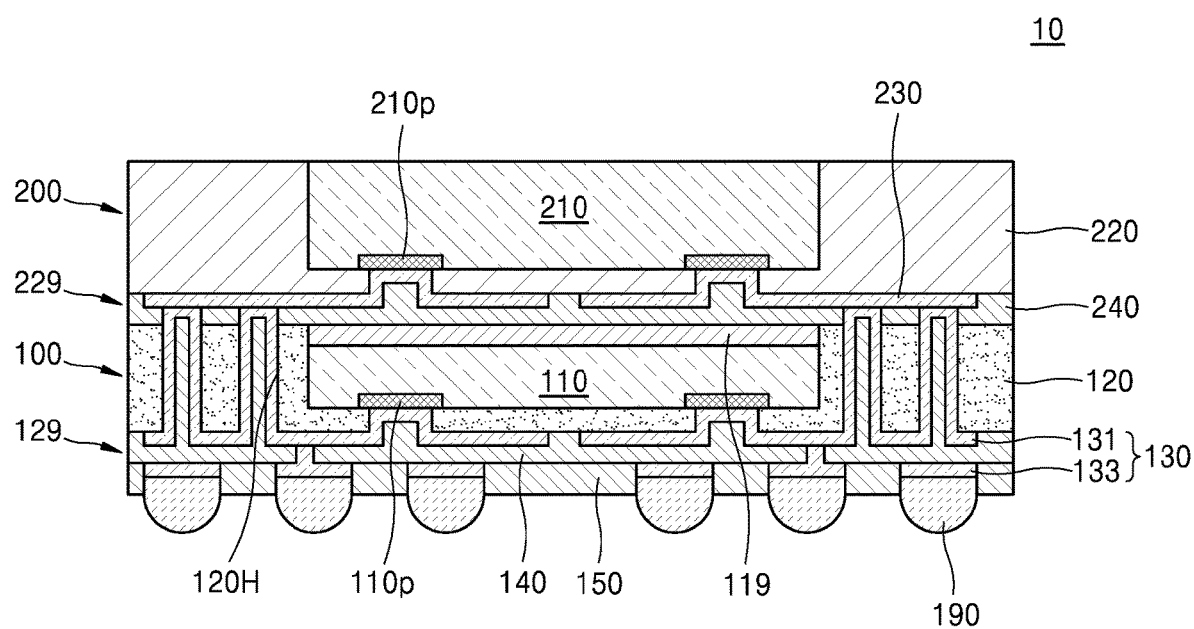
FIG. 1 is a cross-sectional view illustrating a semiconductor package according to exemplary embodiments of the inventive concept.

The disclosure will now be described more fully with reference to the accompanying drawings, in which example embodiments are shown. The subject matter of the disclosure may, however, be embodied in many different forms and should not be construed as being limited to the example embodiments set forth herein. Rather, these embodiments are provided so that the disclosure will convey the subject matter to those skilled in the art. In the drawings, the thicknesses of layers and regions may be exaggerated for clarity. Wherever possible, like reference numerals in the drawings will denote like elements. Therefore, the disclosure is not limited by relative sizes or intervals as shown in the accompanied drawings.

While such terms as "first," "second," etc., may be used to describe various components, such components are not limited to the above terms. The above terms are used only to distinguish one component from another. For example, a first component may indicate a second component or a second component may indicate a first component without conflicting.

The terms used herein in various example embodiments are used to describe example embodiments only, and should not be construed to limit the various additional embodiments. Singular expressions, unless defined otherwise in contexts, include plural expressions. The terms "comprises" or "may comprise" used herein in various example embodiments may indicate the presence of a corresponding function, operation, or component and do not limit one or more additional functions, operations, or components. It will be further understood that the terms "comprises" and/or "comprising," when used in this specification, may be used to specify the presence of stated features, integers, steps, operations, elements, and/or components, but do not preclude the presence or addition of one or more other features, integers, steps, operations, elements, components, and/or groups thereof. Also, expressions such as "at least one of", when preceding a list of elements, modify the entire list of elements and do not modify the individual elements of the list.

When a certain embodiment may be implemented differently, a specific process order may be performed differently from the described order. For example, two consecutively described processes may be performed substantially at the same time or performed in an order opposite to the described order. Variations from the shapes of the illustrations as a result, for example, of manufacturing techniques and/or tolerances, are to be expected. Thus, embodiments of the disclosure should not be construed as limited to the particular shapes of regions illustrated herein, but are to include deviations in shapes that result, for example, from manufacturing. As used herein, the term "and/or" includes any and all combinations of one or more of the associated listed items.

FIG. 1 is a cross-sectional view illustrating a semiconductor package 10 according to exemplary embodiments of the inventive concept.

Referring to FIG. 1, the semiconductor package 10 may include a first package 100 and a second package 200. The semiconductor package 10 may be, for example, a package on package (PoP) type semiconductor package in which the second package 200 is attached onto the first package 100.

The first package 100 may be, for example, a fan-out wafer level package (FOWLP) type semiconductor package.

The first package 100 may include a first semiconductor chip 110. A semiconductor substrate that forms the first semiconductor chip 110 may include, for example, silicon (Si). Alternatively, the semiconductor substrate that forms the first semiconductor chip 110 may include a semiconductor element such as germanium (Ge) or a compound semiconductor such as silicon carbide (SiC), gallium arsenide (GaAs), indium arsenide (InAs), or indium phosphide (InP). Alternatively, the semiconductor substrate that forms the first semiconductor chip 110 may have a silicon on insulator (SOI) structure.

The semiconductor substrate that forms the first semiconductor chip 110 may have an active surface and an inactive surface opposite to the active surface. In the first semiconductor chip 110, a semiconductor device including a plurality of various kinds of individual devices may be formed on the active surface. The plurality of individual devices may include various microelectronic devices, for example, a metal-oxide-semiconductor field effect transistor (MOSFET) such as a complementary metal-insulator-semiconductor (CMOS) transistor, an image sensor such as a system large scale integration (LSI) or a CMOS imaging sensor (CIS), a micro-electro-mechanical system (MEMS), an active device, and a passive device.

The first semiconductor chip 110 may include a plurality of pads 110p. The plurality of pads 110p may be electrically connected to the semiconductor device included in the first semiconductor chip 110. The first semiconductor chip 110 may be one semiconductor chip. However, the inventive concept is not limited thereto. For example, the first semiconductor chip 110 may be a stack of a plurality of semiconductor chips.

In exemplary embodiments, the first semiconductor chip 110 may be, for example, a memory semiconductor chip. The memory semiconductor chip may be a volatile memory semiconductor chip such as dynamic random access memory (DRAM) or static random access memory (SRAM) or a non-volatile memory semiconductor chip such as phase-change random access memory (PRAM), magnetoresistive random access memory (MRAM), ferroelectric random access memory (FeRAM), or resistive random access memory (RRAM).

In addition, in exemplary embodiments, the first semiconductor chip 110 may be a logic chip. For example, the first semiconductor chip 110 may be an artificial intelligence (AI) processor, a central processor unit (CPU), a microprocessor unit (MPU), a graphics processor unit (GPU), or an application processor (AP).

The first package 100 may include a first encapsulation layer 120 that covers at least a part of the first semiconductor chip 110. The first encapsulation layer 120 covers a side surface of the first semiconductor chip 110 and may cover a lower surface of the first semiconductor chip 110 in which the plurality of pads 110p are provided. The first encapsulation layer 120 may have openings for exposing the pads 110p of the first semiconductor chip 110.

The first encapsulation layer 120 may include an insulating material. In exemplary embodiments, the first encapsulation layer 120 may include a photosensitive material. For example, the first encapsulation layer 120 may be formed of a polymer material such as polyimide. The material that forms the first encapsulation layer 120 is not limited thereto. For example, the first encapsulation layer 120 may include an epoxy molding compound (EMC).

The first encapsulation layer 120 may include through holes 120H that vertically pass through the first encapsulation layer 120. The through holes 120H may be provided in a peripheral portion of the first semiconductor chip 110.

The first package 100 may include first redistribution structure 129 provided on the first semiconductor chip 110. The first redistribution structure 129 may include a first redistribution pattern 130 and a first insulating pattern 140.

The first redistribution pattern 130 may electrically connect the pads 110p of the first semiconductor chip 110 to external connection terminals 190. In addition, the first redistribution pattern 130 may be electrically connected to the second redistribution pattern 230. Through the first redistribution pattern 130 and the second redistribution pattern 230, the first semiconductor chip 110 and a second semiconductor chip 210 may be electrically connected to each other and the second semiconductor chip 210 may be electrically connected to the external connection terminals 190.

In more detail, the first redistribution pattern 130 may be formed of a plurality of sub-redistribution patterns and the sub-redistribution patterns may have multilayer structures. For example, the first redistribution pattern 130 may include a first sub-redistribution pattern 131 and a second sub-redistribution pattern 133. The first sub-redistribution pattern 131 may be formed on the first encapsulation layer 120 and may be connected to the pads 110p of the first semiconductor chip 110. Parts of the first sub-redistribution pattern 131 may be connected to the second redistribution pattern 230 through the first encapsulation layer 120 and a second insulating pattern 240. The second sub-redistribution pattern 133 extend on the first insulating pattern 140 and may be connected to the first sub-redistribution pattern 131 through the first insulating pattern 140.

The first insulating pattern 140 may be provided on a lower surface of the first encapsulation layer 120. The first insulating pattern 140 cover the first sub-redistribution pattern 131 and may have openings that expose parts of the first sub-redistribution pattern 131.

A protective layer 150 may be formed on the first insulating pattern 140. The protective layer 150 may expose parts of the second sub-redistribution pattern 133. The external connection terminals 190 may be arranged on the parts of the second sub-redistribution pattern 133 exposed by the protective layer 150. The external connection terminals 190 may be, for example, solder balls or bumps. The external connection terminals 190 may electrically connect the semiconductor package 10 to an external device.

The second package 200 may be arranged on the first package 100. The second package 200 may include the second semiconductor chip 210. The second semiconductor chip 210 may include pads 210p. The second semiconductor chip 210 may be one semiconductor chip. However, the inventive concept is not limited thereto. For example, the second semiconductor chip 210 may be a stack of a plurality of semiconductor chips.

In exemplary embodiments, the second semiconductor chip 210 may be, for example, a memory semiconductor chip. Alternatively, in exemplary embodiments, the second semiconductor chip 210 may be a logic chip.

The second package 200 may include a second encapsulation layer 220 that covers at least a part of the second semiconductor chip 210. For example, the second encapsulation layer 220 covers a side surface of the second semiconductor chip 210 and may cover a lower surface of the second semiconductor chip 210 on which the pads 210p are provided. The second encapsulation layer 220 may have openings for exposing the pads 210p of the second semiconductor chip 210. At this time, the second encapsulation layer 220 may not cover an upper surface of the second semiconductor chip 210, which is opposite to the lower surface of the second semiconductor chip 210.

The second encapsulation layer 220 may include an insulating material. In exemplary embodiments, the second encapsulation layer 220 may include a photosensitive material. For example, the second encapsulation layer 220 may be formed of a polymer material such as polyimide. The material that forms the second encapsulation layer 220 is not limited thereto and may be, for example, EMC.

The second package 200 may include the second redistribution structure 229 provided between the second encapsulation layer 220 and the first encapsulation layer 120. The second redistribution structure 229 may include a second redistribution pattern 230 and a second insulating pattern 240. The second redistribution pattern 230 may extend along a surface of the second encapsulation layer 220 and may be electrically connected to the pads 210p of the second semiconductor chip 210.

According to embodiments of the inventive concept, electrical connection between the second package 200 and the first package 100 may be performed through the first redistribution pattern 130 and the second redistribution pattern 230. Since the semiconductor package 10 does not include inter-package connection terminals such as solder balls for connecting the second package 200 to the first package 100, semiconductor package manufacturing processes may be simplified and a thinner PoP type semiconductor package may be manufactured.

In general, in the case of a PoP type semiconductor package in which a plurality of packages are stacked, due to warpage of the semiconductor package, damage such as cracks occurs in the inter-package connection terminals and accordingly, the reliability of the semiconductor package deteriorates. However, according to exemplary embodiments of the inventive concept, since the second package 200 and the first package 100 may be electrically connected without the inter-package connection terminals vulnerable to warpage, the reliability of the semiconductor package 10 may improve.

FIGS. 2A to 2D are cross-sectional views illustrating a method of manufacturing a semiconductor package, according to exemplary embodiments of the inventive concept. In FIGS. 2A to 2D, a method of manufacturing the semiconductor package 10 illustrated in FIG. 1 will be described.

Figure 2A:
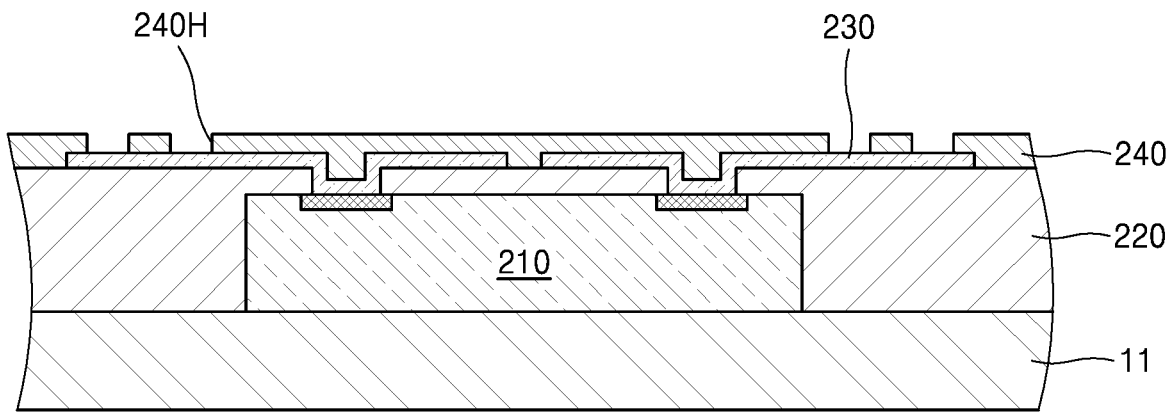
FIG. 2A is a cross-sectional view illustrating a method of manufacturing a semiconductor package, according to exemplary embodiments of the inventive concept.

Referring to FIG. 2A, the second semiconductor chip 210 is arranged on a carrier 11 and the second encapsulation layer 220 that covers the second semiconductor chip 210 is formed. The second encapsulation layer 220 may cover the side surface of the second semiconductor chip 210 and the surface of the second semiconductor chip 210 in which the pads 210p are provided. In exemplary embodiments, in order to form the second encapsulation layer 220, an insulating layer is coated on the carrier 11 and the second semiconductor chip 210 and a part of the insulating layer may be removed so that the pads 210p of the second semiconductor chip 210 are exposed. The insulating layer may include, for example, a photosensitive material.

After forming the second encapsulation layer 220, the second redistribution structure 229 may be formed on the second encapsulation layer 220 and the second semiconductor chip 210. In detail, the second redistribution pattern 230 may be formed on the second encapsulation layer 220 and the pads 210p of the second semiconductor chip 210. For example, the second redistribution pattern 230 may be formed by a seed layer forming process, a mask process, and an electro-plating process. After forming the second redistribution pattern 230, in order to form the second insulating pattern 240, an insulating layer is formed on the second encapsulation layer 220 and the second redistribution pattern 230 and a part of the insulating layer is removed so that openings 240H for exposing parts of the second redistribution pattern 230 may be formed.

Figure 2B:
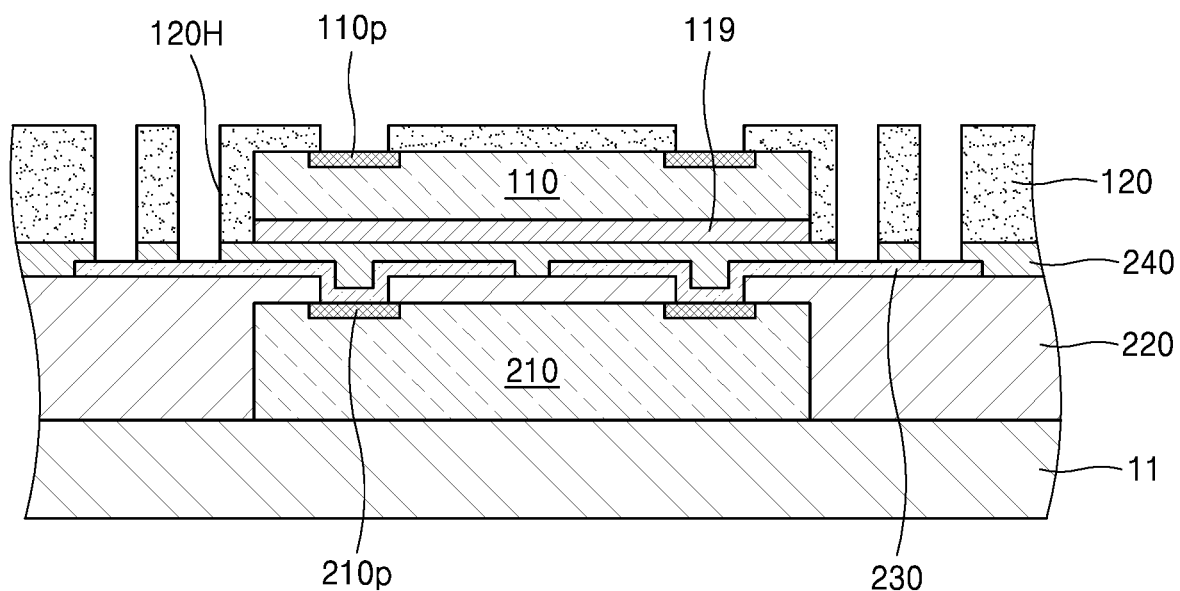
FIG. 2B is a cross-sectional view illustrating a method of manufacturing a semiconductor package, according to exemplary embodiments of the inventive concept.

Referring to FIG. 2B, the first semiconductor chip 110 is arranged on the second insulating pattern 240. Between the first semiconductor chip 110 and the second insulating pattern 240, an adhesive layer 119 for fixing the first semiconductor chip 110 may be provided. The adhesive layer 119 may include, for example, a die attach film. In addition, the adhesive layer 119 may include a material having high thermal conductivity so that heat of the first semiconductor chip 110 may be effectively emitted.

After arranging the first semiconductor chip 110, the first encapsulation layer 120 that covers the first semiconductor chip 110 may be formed. The first encapsulation layer 120 may have openings for exposing the pads 110p of the first semiconductor chip 110 and the through holes 120H that pass through the first encapsulation layer 120 so as to expose the second redistribution pattern 230. In order to form the first encapsulation layer 120, an insulating layer is coated on the carrier 11 and the second semiconductor chip 210, parts of the insulating layer are removed so that the pads 210p of the second semiconductor chip 210 are exposed, and the through holes 120H that vertically pass through the insulating layer may be formed so that the second redistribution pattern 230 are exposed.

In exemplary embodiments of the inventive concept, the first encapsulation layer 120 is formed by a lamination process using a polymer material such as polyimide and may cover the side surface of the first semiconductor chip 110 and the surface of the first semiconductor chip 110 in which the pads 110p are provided. In this case, in comparison with the case in which a process of forming a mold material that covers the side surface of the first semiconductor chip 110 and a process of sequentially forming insulating materials on the lower surface of the first semiconductor chip 110 are performed, since the first encapsulation layer 120 that covers the side surface of the first semiconductor chip 110 and the surface of the first semiconductor chip 110 may be formed by a single lamination process, the semiconductor package manufacturing processes may be simplified.

Figure 2C:
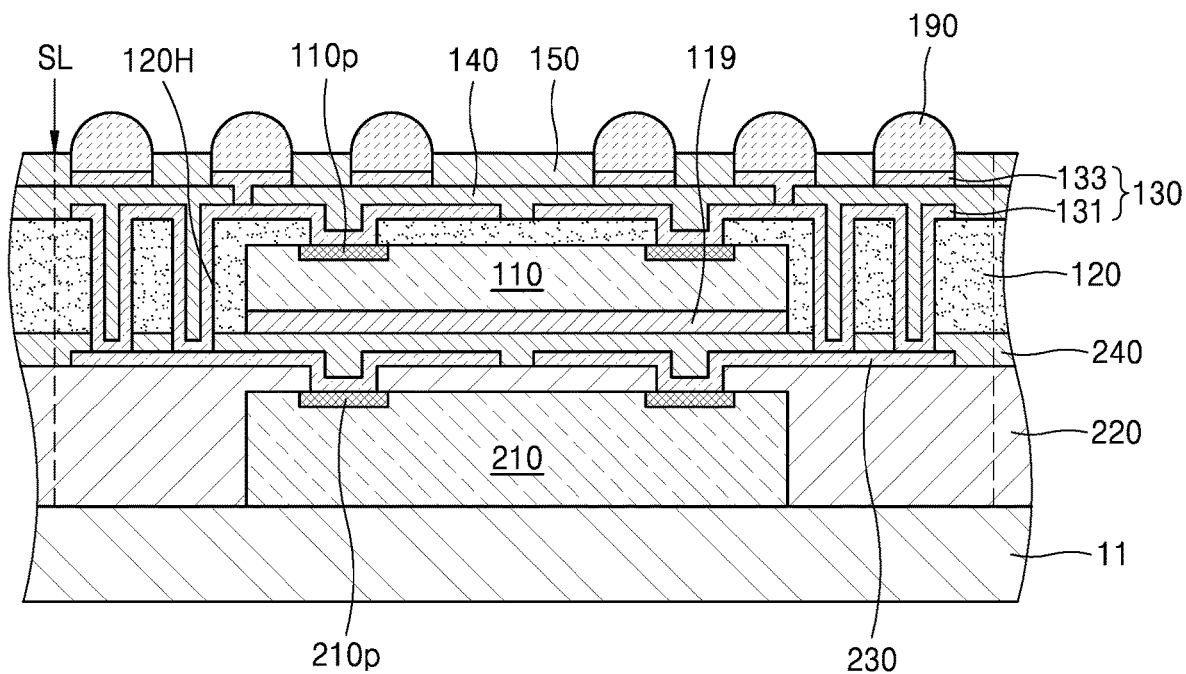
FIG. 2C is a cross-sectional view illustrating a method of manufacturing a semiconductor package, according to exemplary embodiments of the inventive concept.

Referring to FIG. 2C, the first redistribution structure may be formed on the first encapsulation layer 120 and the first semiconductor chip 110. In order to form the first redistribution structure, the first sub-redistribution pattern 131, the first insulating pattern 140, and the second sub-redistribution pattern 133 may be sequentially formed. In more detail, the first sub-redistribution pattern 131 are formed on the first encapsulation layer 120, contact the pads 110p of the first semiconductor chip 110, and extend along the through holes 120H of the first encapsulation layer 120, and may contact the second redistribution pattern 230. For example, the first sub-redistribution pattern 131 may be formed by a seed layer forming process, a mask process, and an electro-plating process. After forming the first sub-redistribution pattern 131, in order to form the first insulating pattern 140, an insulating layer is formed on the first encapsulation layer 120 and the first sub-redistribution pattern 131 and a part of the insulating layer is removed so that openings for exposing parts of the first sub-redistribution pattern 131 may be formed. After forming the first insulating pattern 140, the second sub-redistribution pattern 133 may be formed on the first insulating pattern 140. The second sub-redistribution pattern 133 may be connected to the first sub-redistribution pattern 131 through the first insulating pattern 140. For example, the second sub-redistribution pattern 133 may be formed by a seed layer forming process, a mask process, and an electro-plating process.

Then, the protective layer 150 is formed on the first insulating pattern 140. The protective layer 150 may have openings that expose parts of the second sub-redistribution pattern 133. After forming the protective layer 150, the external connection terminals 190 may be attached onto the second sub-redistribution pattern 133 exposed by the openings of the protective layer 150. The external connection terminals 190 may be, for example, solder balls or bumps.

Figure 2D:
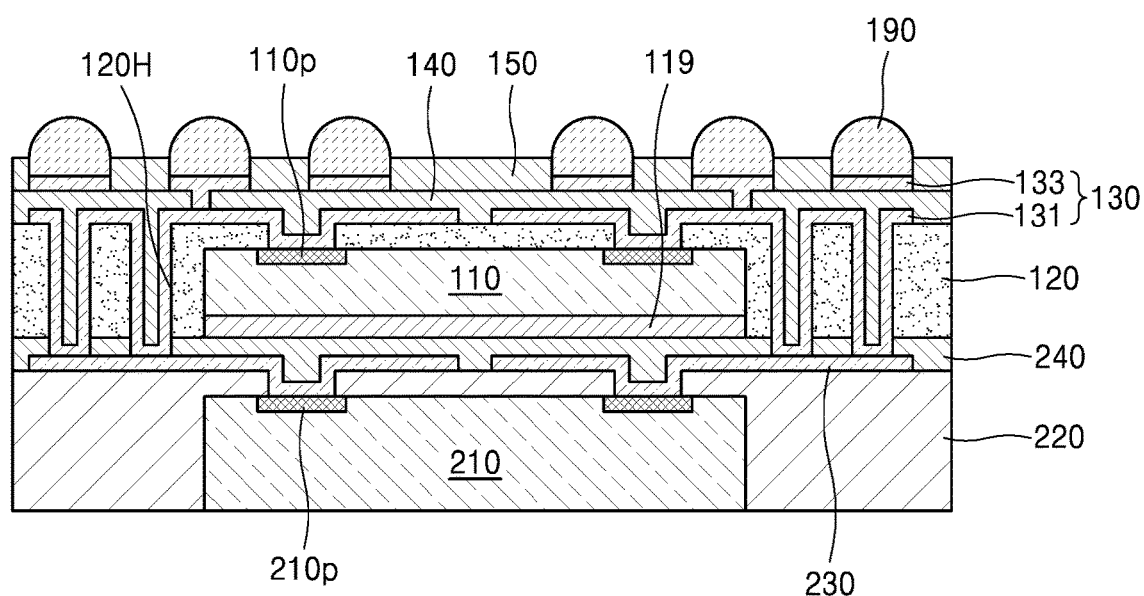
FIG. 2D is a cross-sectional view illustrating a method of manufacturing a semiconductor package, according to exemplary embodiments of the inventive concept.

Referring to FIG. 2D, the carrier (11 of FIG. 2C) is removed and semiconductor packages are singulated to individual semiconductor packages by a sawing process. That is, the semiconductor package illustrated in FIG. 2C is cut off along a scribe lane (SL of FIG. 2C) and may be divided into a plurality of individual semiconductor packages.

Figure 3:
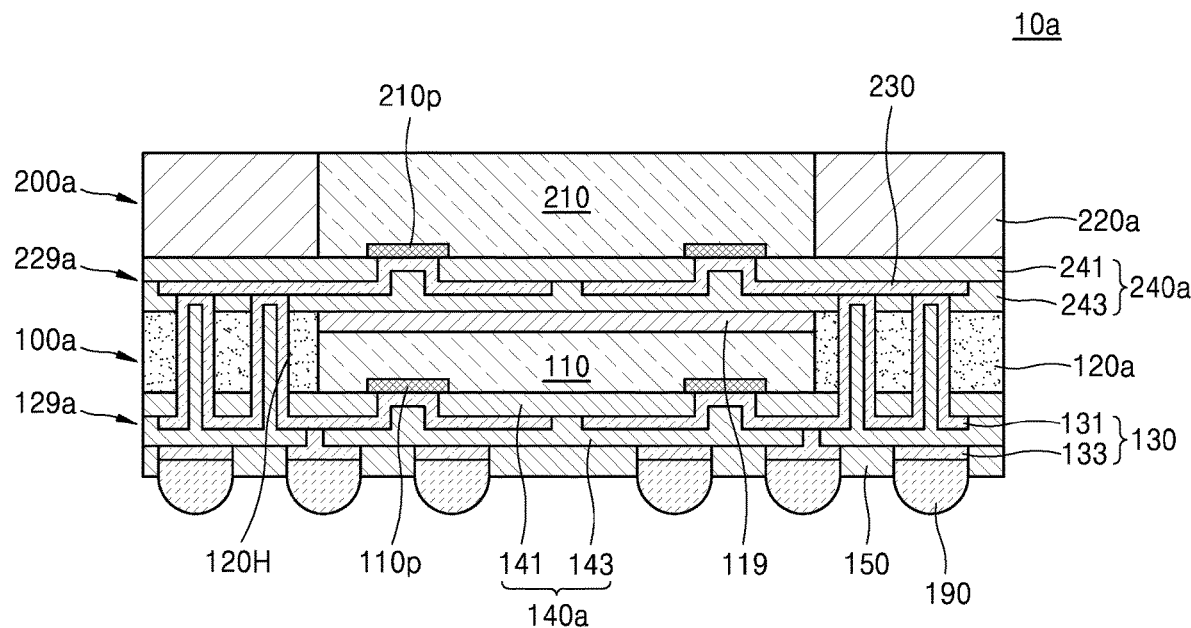
FIG. 3 is a cross-sectional view illustrating a semiconductor package according to exemplary embodiments of the inventive concept.

FIG. 3 is a cross-sectional view illustrating a semiconductor package 10a according to exemplary embodiments of the inventive concept. The semiconductor package 10a illustrated in FIG. 3 may have the same components as those of the semiconductor package 10 illustrated in FIG. 1 excluding a first insulating pattern 140a and a first encapsulation layer 120a that are included in a first package 100a and a second insulating pattern 240a and a second encapsulation layer 220a that are included in a second package 200a. In FIG. 3, the same description as the above description will not be given or will be simply given.

Referring to FIG. 3, the first package 100a may include the first encapsulation layer 120a that covers a side wall of the first semiconductor chip 110. At this time, a lower surface of the first encapsulation layer 120a may be substantially coplanar with the lower surface of the first semiconductor chip 110.

The first encapsulation layer 120a may include an insulating material. In exemplary embodiments, the first encapsulation layer 120a may include a photosensitive material. For example, the first encapsulation layer 120a may be formed of a polymer material such as polyimide.

The first package 100a may include first redistribution structure 129a. The first redistribution structure 129a may include the first redistribution pattern 130 and the first insulating pattern 140a.

The first insulating pattern 140a may include a first sub-insulating pattern 141 and second sub-insulating pattern 143 that are sequentially stacked on the first semiconductor chip 110 and the first encapsulation layer 120a. The first sub-insulating pattern 141 is provided on the lower surface of the first semiconductor chip 110 and the lower surface of the first encapsulation layer 120a and may have openings for exposing the pads 110p of the first semiconductor chip 110. The second sub-insulating pattern 143 are provided on the first sub-insulating pattern 141 and may cover the first sub-redistribution pattern 131 on the first sub-insulating pattern 141.

In exemplary embodiments, the first insulating pattern 140a may include a photosensitive material. For example, the first insulating pattern 140a may be formed of a polymer material such as polyimide. In addition, in exemplary embodiments, the first insulating pattern 140a may be formed of a dielectric material having a low dielectric constant (low-k), a low thermal expansion coefficient (low-CTE), and/or a low cure temperature.

The first redistribution pattern 130 may include the first sub-redistribution pattern 131 and the second sub-redistribution pattern 133. The first sub-redistribution pattern 131 may extend along the first sub-insulating pattern 141 and may be connected to the pads 110p of the first semiconductor chip 110 through the openings of the first sub-insulating pattern 141. In addition, parts of the first sub-redistribution pattern 131 may be connected to the second redistribution pattern 230 through the first sub-insulating pattern 141, the first encapsulation layer 120a, and a second sub-insulating pattern 243.

The second package 200a may include the second encapsulation layer 220a that covers a side wall of a second semiconductor chip 210a. At this time, a lower surface of the second encapsulation layer 220a may be substantially coplanar with the lower surface of the second semiconductor chip 210. In exemplary embodiments, the second encapsulation layer 220a may be formed of EMC. However, the inventive concept is not limited thereto.

The second package 200a may include second redistribution structure 229a. The second redistribution structure 229a may include the second redistribution pattern 230 and the second insulating pattern 240a.

The second insulating pattern 240a may include a first sub-insulating pattern 241 and a second sub-insulating pattern 243 that are sequentially stacked on the second semiconductor chip 210a and the second encapsulation layer 220a. The first sub-insulating pattern 241 is provided on a lower surface of the second semiconductor chip 210a and the lower surface of the second encapsulation layer 220a and may have openings for exposing the pads 210p of the second semiconductor chip 210a. The second sub-insulating pattern 243 is provided on the first sub-insulating pattern 241 and may cover the second redistribution pattern 230 on the first sub-insulating pattern 241.

In exemplary embodiments, the second insulating pattern 240a may include a photosensitive material. For example, the second insulating pattern 240a may be formed of a polymer material such as polyimide. In addition, in exemplary embodiments, the second insulating pattern 240a may be formed of a dielectric material having a low dielectric constant (low-k), a low thermal expansion coefficient (low-CTE), and/or a low cure temperature.

Figure 4:
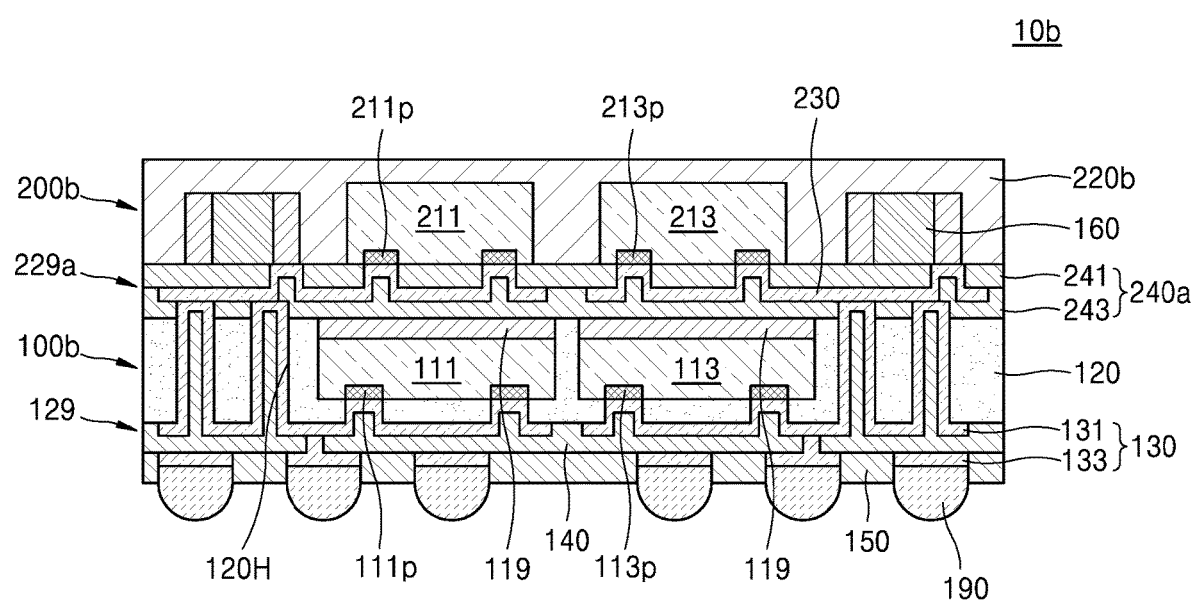
FIG. 4 is a cross-sectional view illustrating a semiconductor package according to exemplary embodiments of the inventive concept.

FIG. 4 is a cross-sectional view illustrating a semiconductor package 10b according to exemplary embodiments of the inventive concept. In FIG. 4, the same description as the above description will not be given or will be simply given.

Referring to FIG. 4, the semiconductor package 10b may include a first package 100b and a second package 200b. The semiconductor package 10b may be, for example, a PoP type semiconductor package in which the second package 200b is attached onto the first package 100b. The first package 100b may be, for example, an FOWLP type semiconductor package.

The first package 100b may include a plurality of semiconductor chips. For example, the first package 100b may include a first lower semiconductor chip 111 and a second lower semiconductor chip 113 that are horizontally apart from each other. In exemplary embodiments, the first lower semiconductor chip 111 and the second lower semiconductor chip 113 may be the same kind of semiconductor chip. Alternatively, in exemplary embodiments, the first lower semiconductor chip 111 and the second lower semiconductor chip 113 may be different kinds of semiconductor chips.

The first package 100b may include the first encapsulation layer 120 that covers at least a part of the first lower semiconductor chip 111 and at least a part of the second lower semiconductor chip 113. The first encapsulation layer 120 may include an insulating material. In exemplary embodiments, the first encapsulation layer 120 may be formed of a photosensitive material, for example, a polymer material such as polyimide.

The second package 200b may include a plurality of semiconductor chips. For example, the second package 200b may include a first upper semiconductor chip 211 and a second upper semiconductor chip 213 that are horizontally spaced apart from each other. In exemplary embodiments, the first upper semiconductor chip 211 and the second upper semiconductor chip 213 may be the same kind of semiconductor chips. Alternatively, in exemplary embodiments, the first upper semiconductor chip 211 and the second upper semiconductor chip 213 may be different kinds of semiconductor chips.

Furthermore, in exemplary embodiments, the second package 200b may be a system in package type semiconductor package in which various circuit devices that perform a signal processing function, for example, a passive device 160, are packaged.

The second package 200b may include a second encapsulation layer 220b that covers at least a part of the first upper semiconductor chip 211 and at least a part of the second upper semiconductor chip 213. The second encapsulation layer 220b may be filled between the first upper semiconductor chip 211 and the second upper semiconductor chip 213. In exemplary embodiments, the second encapsulation layer 220b may be formed of EMC. However, the inventive concept is not limited thereto.

FIGS. 5A to 5E are cross-sectional views illustrating a method of manufacturing a semiconductor package, according to exemplary embodiments of the inventive concept. In FIGS. 5A to 5E, a method of manufacturing the semiconductor package 10b illustrated in FIG. 4 will be described.

Figure 5A:
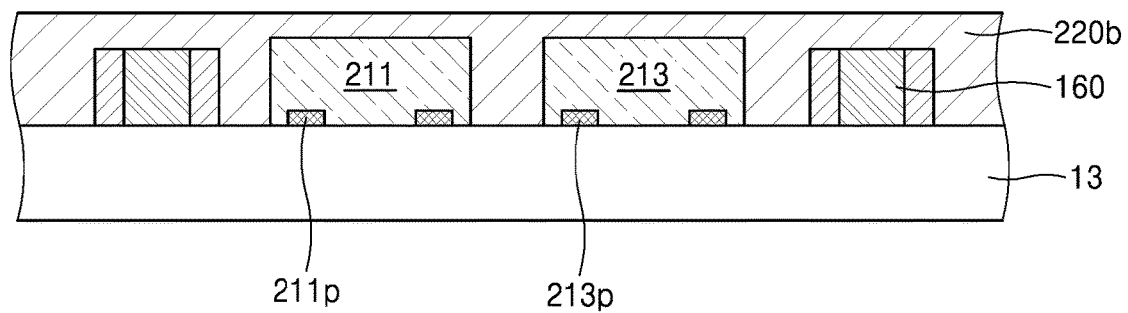
FIG. 5A is a cross-sectional view illustrating a method of manufacturing a semiconductor package, according to exemplary embodiments of the inventive concept.

Referring to FIG. 5A, the first upper semiconductor chip 211 and the second upper semiconductor chip 213 are arranged on a supporting substrate 13. Then, the second encapsulation layer 220b that covers the first upper semiconductor chip 211 and the second upper semiconductor chip 213 is formed on the supporting substrate 13. In exemplary embodiments, the second encapsulation layer 220b may include EMC. Alternatively, in exemplary embodiments, the second encapsulation layer 220b may include an insulating layer including a photosensitive material like the second encapsulation layer 220 of FIG. 2A.

Figure 5B:
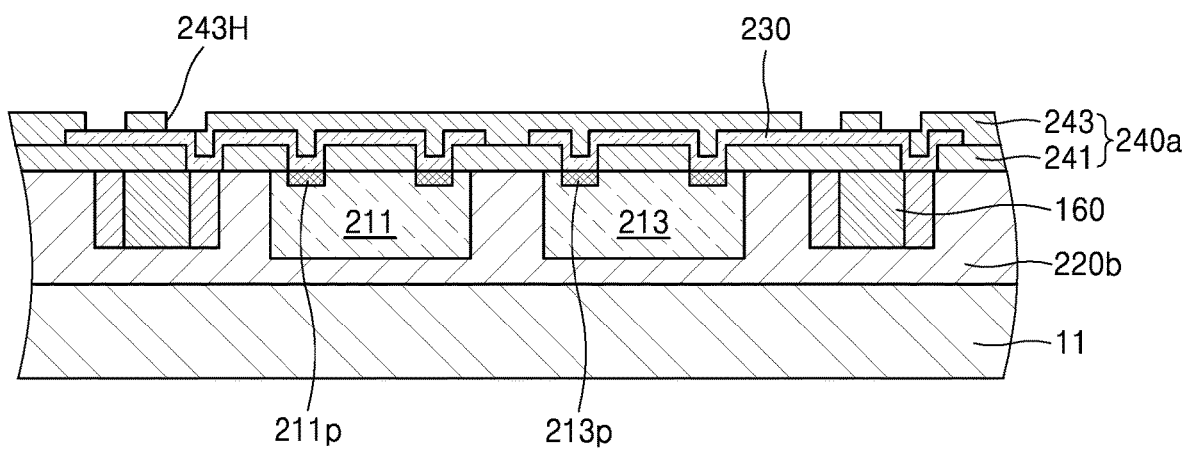
FIG. 5B is a cross-sectional view illustrating a method of manufacturing a semiconductor package, according to exemplary embodiments of the inventive concept.

Referring to FIG. 5B, the supporting substrate 13 is removed from the resultant structure of FIG. 5A and the resultant structure is flipped over and arranged on the carrier 11.

Then, the second redistribution structure may be formed on the second encapsulation layer 220b, the first upper semiconductor chip 211, and the second upper semiconductor chip 213. In order to form the second redistribution structure, the first sub-insulating pattern 241, the second redistribution pattern 230, and the second sub-insulating pattern 243 may be sequentially formed. In more detail, in the first sub-insulating pattern 241, an insulating layer is formed on the first upper semiconductor chip 211 and the second upper semiconductor chip 213 and a part of the insulating layer is removed so that openings for exposing pads 211p of the first upper semiconductor chip 211 and pads 213p of the second upper semiconductor chip 213 may be formed. After forming the first sub-insulating pattern 241, the second redistribution pattern 230 may be formed on the first sub-insulating pattern 241. For example, the second redistribution pattern 230 may be formed by a seed layer forming process, a mask process, and an electro-plating process. After forming the second redistribution pattern 230, the second sub-insulating pattern 243 that covers the second redistribution pattern 230 may be formed on the first sub-insulating pattern 241. The second sub-insulating pattern 243 may have openings 243H for exposing parts of the second redistribution pattern 230.

Figure 5C:
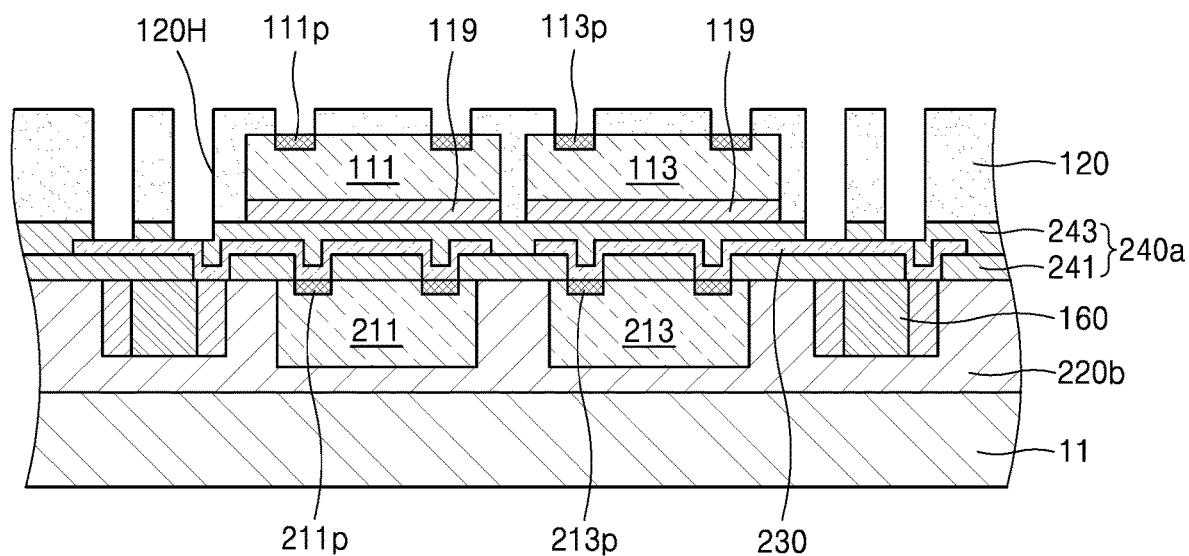
FIG. 5C is a cross-sectional view illustrating a method of manufacturing a semiconductor package, according to exemplary embodiments of the inventive concept.

Referring to FIG. 5C, the first lower semiconductor chip 111 and the second lower semiconductor chip 113 are arranged on the second sub-insulating pattern 243. Between the first lower semiconductor chip 111 and the second insulating pattern 240a and between the second lower semiconductor chip 113 and the second sub-insulating pattern 243, the adhesive layer 119 for fixing the first lower semiconductor chip 111 and the second lower semiconductor chip 113 may be provided.

After forming the first lower semiconductor chip 111 and the second lower semiconductor chip 113, the first encapsulation layer 120 that covers the first lower semiconductor chip 111 and the second lower semiconductor chip 113 may be formed. The first encapsulation layer 120 may have the through holes 120H that vertically pass through the first encapsulation layer 120 and openings that expose the pads 111p of the first lower semiconductor chip 111 and the pads 113p of the second lower semiconductor chip 113 by a similar method to that described in FIG. 2B.

Figure 5D:
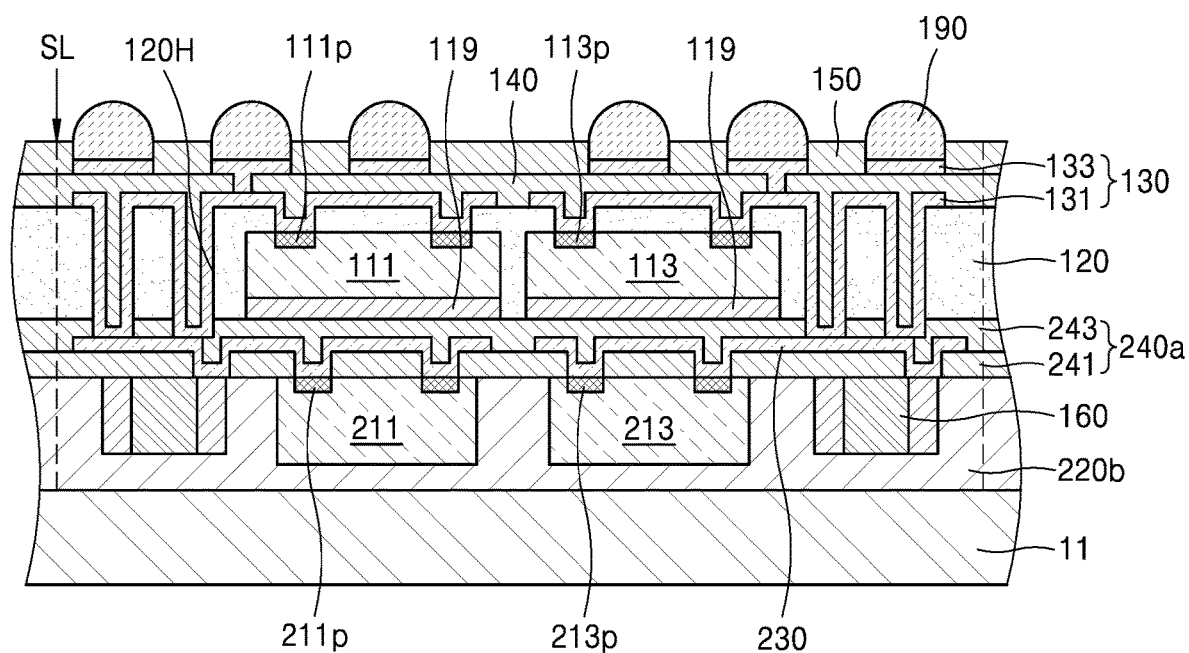
FIG. 5D is a cross-sectional view illustrating a method of manufacturing a semiconductor package, according to exemplary embodiments of the inventive concept.

Referring to FIG. 5D, the first redistribution structure may be formed on the first encapsulation layer 120, the first lower semiconductor chip 111, and the second lower semiconductor chip 113. In order to form the first redistribution structure, the first sub-redistribution pattern 131, the first insulating pattern 140, and the second sub-redistribution pattern 133 may be sequentially formed by a similar method to that described in FIG. 2C.

Then, by a similar method to that described in FIG. 2C, the protective layer 150 on the first insulating pattern 140 and the external connection terminals 190 attached to the protective layer 150 may be formed.

Figure 5E:
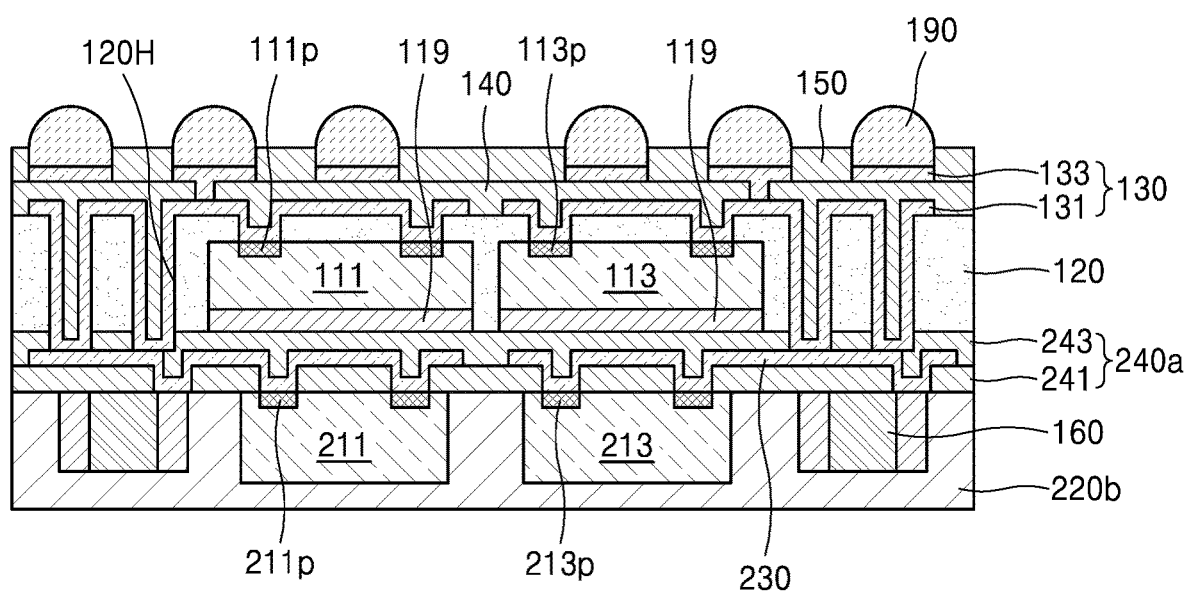
FIG. 5E is a cross-sectional view illustrating a method of manufacturing a semiconductor package, according to exemplary embodiments of the inventive concept.

Referring to FIG. 5E, the carrier (11 of FIG. 5D) is removed and the semiconductor package illustrated in FIG. 5D is cut off along a scribe lane (SL of FIG. 5D) so that the semiconductor package of FIG. 5D may be singulated to a plurality of individual semiconductor packages.

Figure 6:
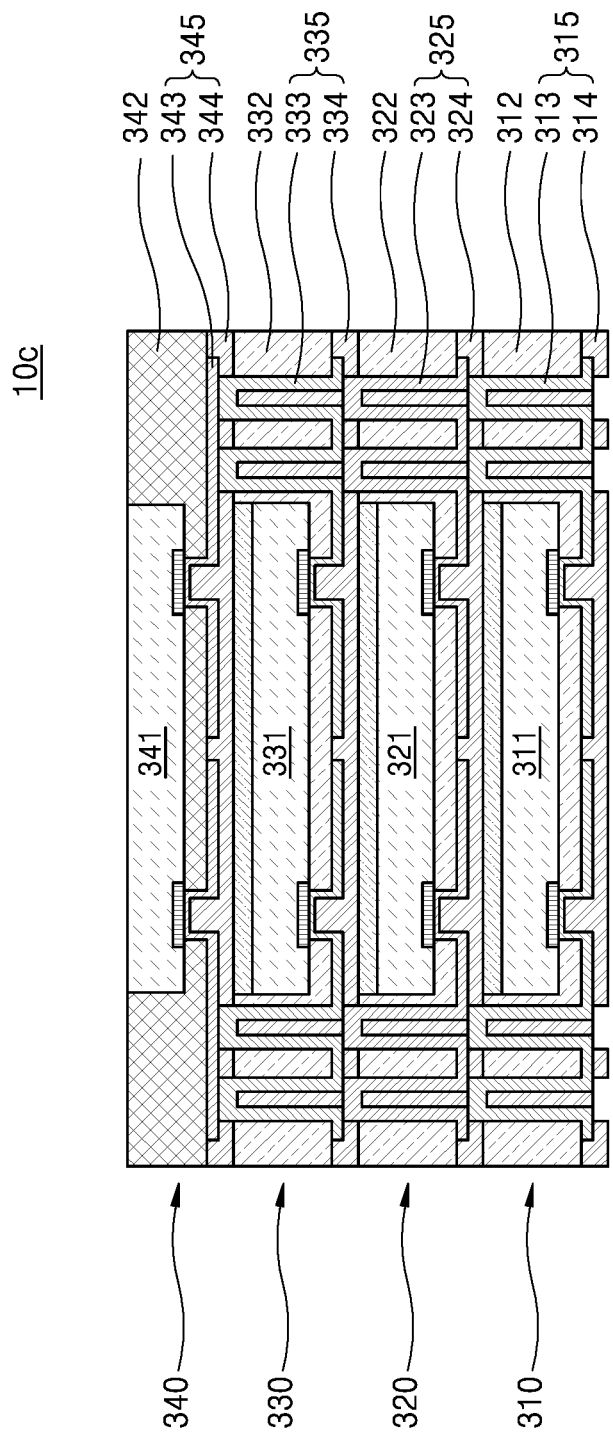
FIG. 6 is a cross-sectional view illustrating a semiconductor package according to exemplary embodiments of the inventive concept.

FIG. 6 is a cross-sectional view illustrating a semiconductor package 10c according to exemplary embodiments of the inventive concept. In FIG. 6, the same description as the above description will not be given or will be simply given.

Referring to FIG. 6, the semiconductor package 10c may include a first package 310, a second package 320, a third package 330, and a fourth package 340 that are stacked in a vertical direction. The first package 310, the second package 320, the third package 330, and the fourth package 340 may be FOWLP type semiconductor packages.

The first package 310 may include a first semiconductor chip 311, a first encapsulation layer 312, and first redistribution structure 315. The second package 320 may include a second semiconductor chip 321, a second encapsulation layer 322, and second redistribution structure 325. The third package 330 may include a third semiconductor chip 331, a third encapsulation layer 332, and third redistribution structure 335. For example, since the first package 310, the second package 320, and the third package 330 may have similar technological characteristics to that of the first package (100 of FIG. 1) previously described with reference to FIG. 1, detailed description thereof will not be given.

The fourth package 340 may include a fourth semiconductor chip 341, a fourth encapsulation layer 342, and fourth redistribution structure 345. For example, since the fourth package 340 may have a similar technological characteristic as that of the second package (200 of FIG. 1) described with reference to FIG. 1, detailed description thereof will not be given.

The first semiconductor chip 311 of the first package 310, the second semiconductor chip 321 of the second package 320, the third semiconductor chip 331 of the third package 330, and the fourth semiconductor chip 341 of the fourth package 340 may be the same kind of semiconductor chips or different kinds of semiconductor chips.

In exemplary embodiments of the inventive concept, electrical connection between the first to fourth semiconductor chips 311, 321, 331, and 341 may be implemented by first redistribution pattern 313 of the first package 310 that extend through the first encapsulation layer 312 and a second insulating pattern 324, second redistribution pattern 323 of the second package 320 that extend through the second encapsulation layer 322 and a third insulating pattern 334, third redistribution pattern 333 of the third package 330 that extend through a third encapsulation layer 332 and a fourth insulating pattern 344, and fourth redistribution pattern 343 of the fourth package 340. Since the first to fourth packages 310, 320, 330, and 340 may be electrically connected without inter-package connection terminals vulnerable to warpage, the reliability of the semiconductor package 10c may improve. In addition, since the plurality of packages may be stacked without the inter-package connection terminals, the thinner semiconductor package 10c may be manufactured.

Figure 7:
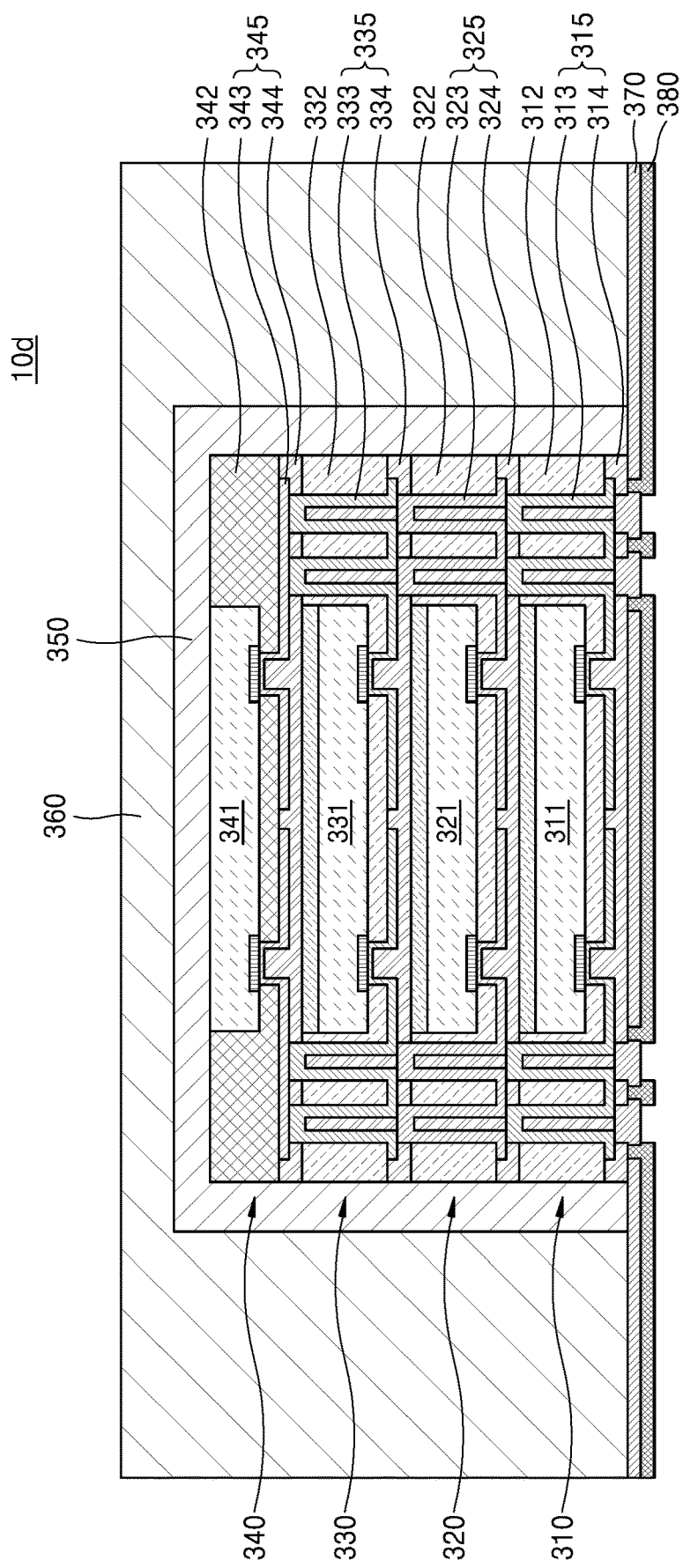
FIG. 7 is a cross-sectional view illustrating a semiconductor package according to exemplary embodiments of the inventive concept.

FIG. 7 is a cross-sectional view illustrating a semiconductor package 10d according to exemplary embodiments of the inventive concept. In FIG. 7, the same description as the above description will not be given or will be simply given.

Referring to FIG. 7, the semiconductor package 10d may include the first package 310, the second package 320, the third package 330, and the fourth package 340 that are stacked in a vertical direction. For example, since the first to fourth packages 310, 320, 330, and 340 may have similar technological characteristics to that of the semiconductor package 10c described with reference to FIG. 6, detailed description thereof will be omitted.

The semiconductor package 10d may include an electromagnetic shielding layer 350 that covers at least parts of the first package 310, the second package 320, the third package 330, and the fourth package 340. For example, as illustrated in FIG. 7, the electromagnetic shielding layer 350 may cover side walls of the first package 310, side walls of the second package 320, side walls of the third package 330, and side walls and an upper surface of the fourth package 340. The electromagnetic shielding layer 350 shields electromagnetic interference (EMI) and may prevent the performance of the semiconductor package 10d from deteriorating due to EMI.

For example, in order to form the electromagnetic shielding layer 350, a conductive material layer that covers the first to fourth packages 310, 320, 330, and 340 may be formed by using a method such as chemical vapor deposition (CVD), electroless plating, electrolytic plating, spraying, or sputtering. The electromagnetic shielding layer 350 may include a conductive material such as copper (Cu), silver (Ag), or platinum (Pt).

The semiconductor package 10d may include an external encapsulation layer 360 that covers the electromagnetic shielding layer 350 that covers the first to fourth packages 310, 320, 330, and 340. In exemplary embodiments, the external encapsulation layer 360 may include a material having high thermal conductivity so that a heat emission characteristic of the semiconductor package 10d improves.

The semiconductor package 10d may include a lower conductive layer 370 and a thermal conductive film 380 that are provided on a lower surface of the first package 310 and a lower surface of the external encapsulation layer 360.

The lower conductive layer 370 may extend from a surface of the first insulating pattern 314 of the first package 310, a surface of the external encapsulation layer 360, and/or a surface of the electromagnetic shielding layer 350 between the first package 310 and the external encapsulation layer 360.

A part of the lower conductive layer 370 extends along the first insulating pattern 314 and may be connected to the first redistribution pattern 313 of the first package 310 through the openings of the first insulating pattern 314.

In addition, a part of the lower conductive layer 370 is connected to the electromagnetic shielding layer 350 and may function as an electrical path for grounding an electromagnetic wave incident on the electromagnetic shielding layer 350.

For example, the lower conductive layer 370 may include a conductive material. For example, the lower conductive layer 370 may include a material having low resistivity, for example, Cu.

The thermal conductive film 380 may be provided on the surface of the first insulating pattern 314 of the first package 310, the surface of the external encapsulation layer 360, and/or the surface of the electromagnetic shielding layer 350 between the first package 310 and the external encapsulation layer 360. The thermal conductive film 380 covers the lower conductive layer 370 and may include openings that expose parts of the lower conductive layer 370.

For example, the thermal conductive film 380 may include an insulating material having high thermal conductivity.

Figure 8A:
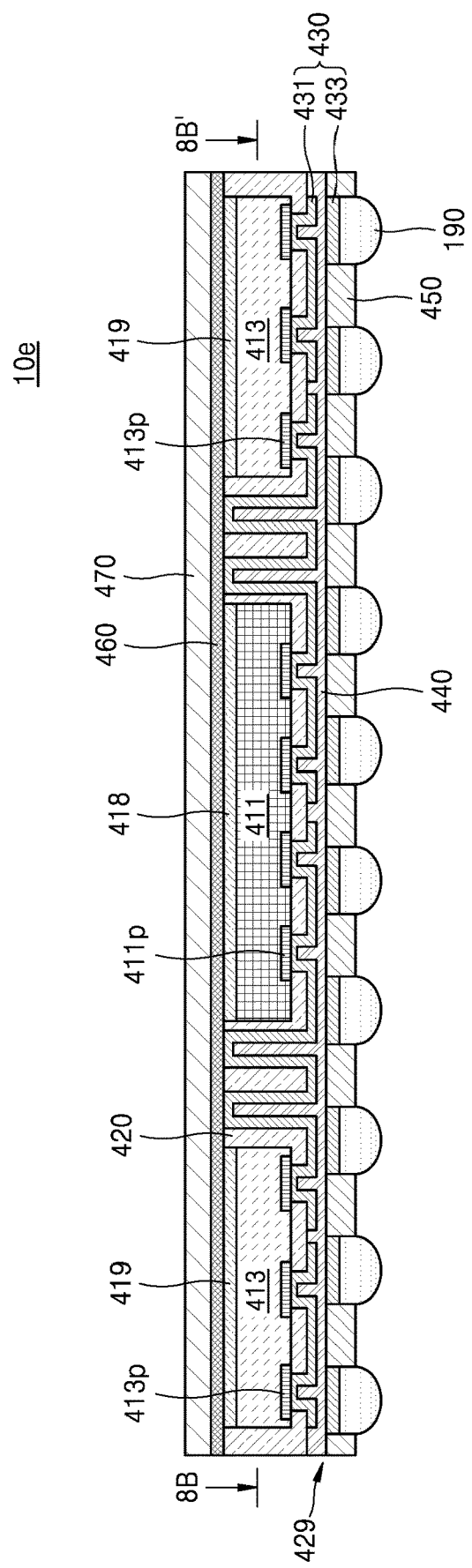
FIG. 8A is a cross-sectional view illustrating a semiconductor package according to exemplary embodiments of the inventive concept.
Figure 8B:
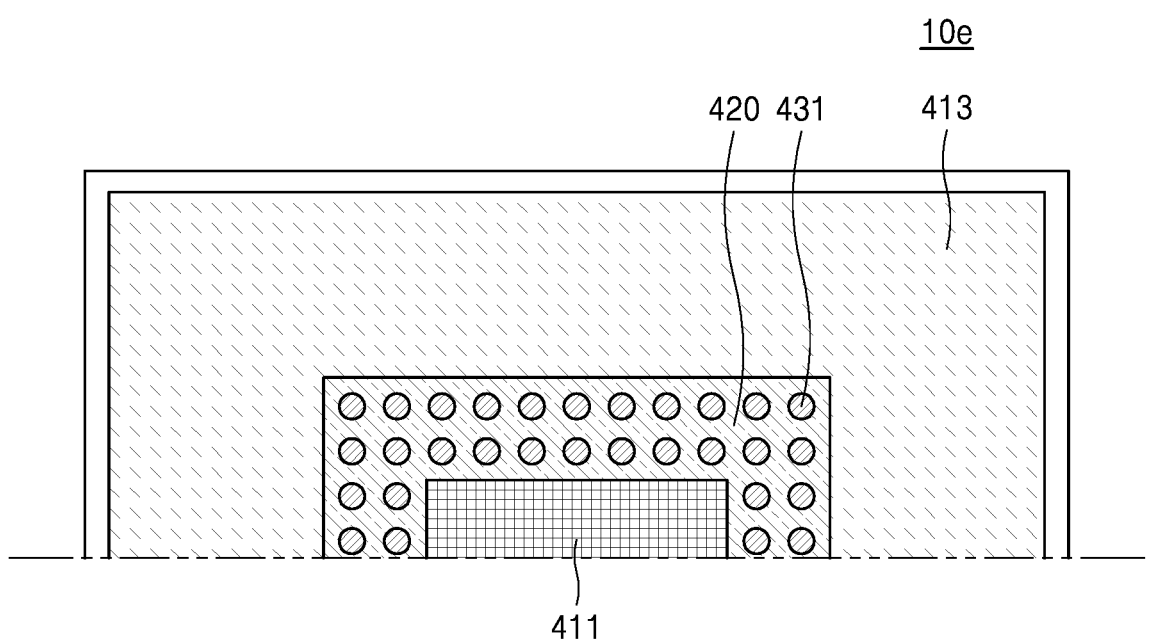
FIG. 8B is a cross-sectional view illustrating a semiconductor package taken along the line 8B-8B' of FIG. 8A.

FIG. 8A is a cross-sectional view illustrating a semiconductor package 10e according to exemplary embodiments of the inventive concept. FIG. 8B is a cross-sectional view illustrating the semiconductor package taken along the line 8B-8B' of FIG. 8A.

Referring to FIGS. 8A and 8B, the semiconductor package 10e may include a semiconductor chip 411 and passive parts 413. The semiconductor package 10e may be a system in package in which the semiconductor chip 411 and the passive parts 413 are packaged by a fan-out method.

In exemplary embodiments, the semiconductor chip 411 may be a logic chip. For example, the semiconductor chip 411 may be an AI processor. Alternatively, the semiconductor chip 411 may be a CPU, an MPU, a GPU, or an AP. Alternatively, in exemplary embodiments, the semiconductor chip 411 may be a memory semiconductor chip.

In exemplary embodiments, the passive parts 413 may include an integrated passive device (IPD). The IPD may include, for example, various kinds of passive devices provided on a silicon substrate.

In exemplary embodiments, the passive parts 413 may include various kinds of passive devices formed on a substrate having a cavity that may accommodate the semiconductor chip 411. For example, as illustrated in FIG. 8B, the passive parts 413 may be ring-shaped to surround the semiconductor chip 411.

Alternatively, in other exemplary embodiments, the semiconductor package 10e may include the plurality of passive parts 413 spaced apart from each other.

The semiconductor package 10e may include an encapsulation layer 420 that molds the semiconductor chip 411 and the passive parts 413 so that the semiconductor chip 411 and the passive parts 413 are integrated with each other. The encapsulation layer 420 may cover at least a part of the semiconductor chip 411 and at least parts of the passive parts 413. For example, the encapsulation layer 420 may cover side walls of the semiconductor chip 411 and a lower surface of the semiconductor chip 411 on which the pads 411p of the semiconductor chip 411 are provided and side walls of the passive parts 413 and lower surfaces of the passive parts 413 on which pads 413p of the passive parts 413 are provided.

The semiconductor package 10e may include redistribution structure 429. The redistribution structure 429 may include redistribution pattern 430 and an insulating pattern 440.

The redistribution pattern 430 may electrically connect the pads 411p of the semiconductor chip 411 to the external connection terminals 190 and may electrically connect the pads 413p of the passive parts 413 to the external connection terminals 190. The redistribution pattern 430 may be formed of a plurality of sub-redistribution patterns such that the redistribution pattern 430 may have a multilayer structures. For example, the redistribution pattern 430 may include a first sub-redistribution pattern 431 and second sub-redistribution pattern 433. The first sub-redistribution pattern 431 may extend along a surface of the encapsulation layer 420, is connected to the pads 411p of the semiconductor chip 411, and may be connected to the pads 413p of the passive parts 413. In addition, a part of the first sub-redistribution pattern 431 may extend in a vertical direction through the encapsulation layer 420.

The insulating pattern 440 is provided on a lower surface of the encapsulation layer 420 and may cover at least a part of the first sub-redistribution pattern 431.

A protective layer 450 may be formed on the insulating pattern 440. The protective layer 450 covers the second sub-redistribution pattern 433 and may expose parts of the second sub-redistribution pattern 433. The external connection terminals 190 may be arranged in the parts of the second sub-redistribution pattern 433 that are exposed by the protective layer 450.

A thermal conductive film 460 and a heat emission plate 470 may be provided on an upper surface of the semiconductor chip 411 and upper surfaces of the passive parts 413. An adhesive layer 418 for fixing the semiconductor chip 411 may be provided between the upper surface of the semiconductor chip 411 and the thermal conductive film 460. An adhesive layer 419 for fixing the passive parts may be provided between the upper surfaces of the passive parts 413 and the thermal conductive film 460. In exemplary embodiments, the adhesive layers 418 and 419 may include a material having high thermal conductivity so that a heat emission characteristic of the semiconductor chip 411 and a heat emission characteristic of the passive parts 413 improve.

Figure 9:
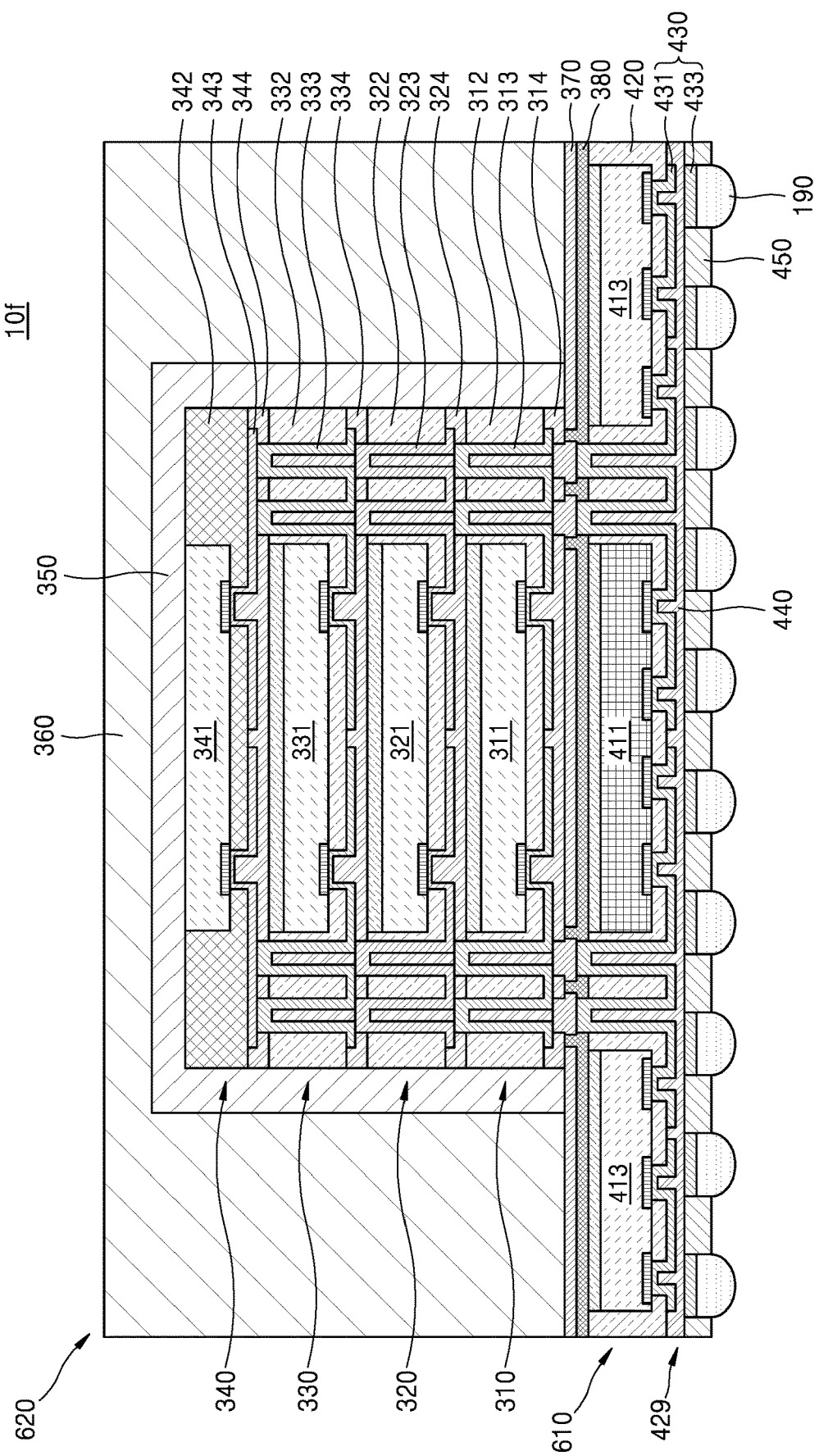
FIG. 9 is a cross-sectional view illustrating a semiconductor package according to exemplary embodiments of the inventive concept.

FIG. 9 is a cross-sectional view illustrating a semiconductor package 10f according to exemplary embodiments of the inventive concept. In FIG. 9, the same description as the above description will not be given or will be simply given.

Referring to FIG. 9, the semiconductor package 10f may include a lower package 610 and an upper package 620. Since the lower package 610 may have the same components as the semiconductor package 10e illustrated in FIGS. 8A and 8B and the upper package 620 may have the same components as the semiconductor package 10d illustrated in FIG. 7, detailed description of the lower package 610 and the upper package 620 will not be given.

As illustrated in FIG. 9, a first sub-redistribution pattern 431 provided in the lower package 610 may extend through the encapsulation layer 420 and the thermal conductive film 380 of the lower package 610 and may be connected to the lower conductive layer 370. That is, the semiconductor chip 411 of the lower package 610 and the first to fourth semiconductor chips 311, 321, 331, and 341 of the upper package 620 may be connected through the redistribution pattern 430 of the lower package 610, the lower conductive layer 370 of the upper package 620, and the first to fourth redistribution pattern 313, 323, 333, and 343 of the upper package 620.

In exemplary embodiments, the semiconductor chip 411 of the lower package 610 is an AI processor and the first to fourth semiconductor chips 311, 321, 331, and 341 of the upper package 620 may be memory semiconductor chips configured to transmit and receive an electrical signal to and from the semiconductor chip 411 of the lower package 610.

In exemplary embodiments of the inventive concept, since the lower package 610 and the upper package 620 may be electrically connected to each other without inter-package connection terminals vulnerable to warpage, the reliability of the semiconductor package 10f may improve. In addition, since a plurality of packages may be stacked without inter-package connection terminals, the thinner semiconductor package 10f may be manufactured.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:
  a first package including a first semiconductor chip, a first encapsulation layer that covers the first semiconductor chip, a first redistribution pattern electrically connected to pads of the first semiconductor chip, and a first insulating pattern that covers the first redistribution pattern; and
  a second package on the first package, the second package including a second semiconductor chip, a second encapsulation layer that covers the second semiconductor chip, and a second redistribution pattern electrically connected to pads of the second semiconductor chip,
  wherein the first encapsulation layer includes a first through hole extending from an upper surface of the first encapsulation layer to a lower surface of the first encapsulation layer opposite the upper surface of the first encapsulation layer, the upper surface of the first encapsulation layer being in contact with the second package,
  wherein the first redistribution pattern extends continuously along the lower surface of the first encapsulation layer and a sidewall of the first through hole, and is directly connected to the second redistribution pattern,
  wherein the first redistribution pattern partially fills the first through hole,
  wherein the first insulating pattern partially fills the first through hole and contacts the first redistribution pattern provided in the first through hole,
  wherein the first encapsulation layer contacts a lower surface of the first semiconductor chip in which pads of the first semiconductor chip are provided, and
  wherein the first redistribution pattern directly contacts the lower surface of the first encapsulation layer and the sidewall of the first through hole.

2. The semiconductor package of claim 1, wherein the first encapsulation layer comprises a photosensitive insulating material.

3. The semiconductor package of claim 1, wherein the second package further comprises passive devices electrically connected to the second redistribution pattern.

4. The semiconductor package of claim 1, wherein the second encapsulation layer contacts a lower surface of the second semiconductor chip in which pads of the second semiconductor chip are provided.

5. The semiconductor package of claim 1, wherein the second encapsulation layer comprises a photosensitive insulating material.

6. The semiconductor package of claim 1, further comprising a second insulating pattern that covers at least a part of a surface of the second semiconductor chip in which pads of the second semiconductor chip are provided,
  wherein the second encapsulation layer covers a side surface of the second semiconductor chip.

7. The semiconductor package of claim 1, further comprising an electromagnetic shielding layer that covers at least a part of the first package and at least a part of the second package.

8. The semiconductor package of claim 7, further comprising an external encapsulation layer that covers the first package, the second package, and the electromagnetic shielding layer.

9. The semiconductor package of claim 8, further comprising a lower conductive layer that extends on the first package and the external encapsulation layer,
- wherein the lower conductive layer is connected to the first redistribution pattern of the first package and the electromagnetic shielding layer.

10. The semiconductor package of claim 9, further comprising a thermal conductive film provided on the first package and the external encapsulation layer and covering at least a part of the lower conductive layer.

11. The semiconductor package of claim 1, further comprising:
- an external encapsulation layer that covers side surfaces of the first package and side surfaces of the second package; and
- a third package provided under the first package and the external encapsulation layer,
- wherein the third package comprises a third semiconductor chip, an integrated passive device (IPD), a third encapsulation layer that covers the third semiconductor chip and the IPD, and third redistribution pattern electrically connected to the third semiconductor chip and the first redistribution pattern,
- wherein the third encapsulation layer includes an upper surface and a lower surface opposite to each other, the upper surface of the third encapsulation layer being in contact with the first package and the external encapsulation layer, and
- wherein the third redistribution pattern extends continuously along the lower surface of the third encapsulation layer and a sidewall of the third encapsulation layer, the sidewall of the third encapsulation layer extending from the upper surface of the third encapsulation layer to the lower surface of the third encapsulation layer.

12. The semiconductor package of claim 11, wherein the third semiconductor chip comprises an artificial intelligence (AI) processor.

13. The semiconductor package of claim 11, wherein the IPD is ring-shaped to surround the third semiconductor chip.

14. A semiconductor package comprising:
- a first package including a first semiconductor chip, a first encapsulation layer that covers the first semiconductor chip, a first redistribution pattern electrically connected to pads of the first semiconductor chip, and a first insulating pattern that covers the first redistribution pattern; and
- a second package on the first package, the second package including a second semiconductor chip, a second encapsulation layer that covers the second semiconductor chip, and a second redistribution pattern electrically connected to pads of the second semiconductor chip,
- wherein the first encapsulation layer includes a first through hole extending from an upper surface of the first encapsulation layer to a lower surface of the first encapsulation layer opposite the upper surface of the first encapsulation layer, the upper surface of the first encapsulation layer being in contact with the second package,
- wherein the first redistribution pattern extends continuously along the lower surface of the first encapsulation layer and a sidewall of the first through hole, and is directly connected to the second redistribution pattern,
- wherein the first redistribution pattern partially fills the first through hole,
- wherein the first insulating pattern partially fills the first through hole and contacts the first redistribution pattern provided in the first through hole, and
- wherein the first redistribution pattern provided in the first through hole surrounds the first insulating pattern provided in the first through hole.

\* \* \* \* \*